(12) United States Patent
Darr et al.

(10) Patent No.: US 8,494,104 B2
(45) Date of Patent: Jul. 23, 2013

(54) NICAM DECODER WITH OUTPUT RESAMPLER

(75) Inventors: Roger R. Darr, Suwanee, GA (US); Matthew F. Easley, Woodstock, GA (US); Matthew S. Barnhill, Duluth, GA (US)

(73) Assignee: THAT Corporation, Milford, MA (US)

( * ) Notice: Subject to any disclaimer, the term of this patent is extended or adjusted under 35 U.S.C. 154(b) by 0 days.

(21) Appl. No.: 13/236,291

(22) Filed: Sep. 19, 2011

(65) Prior Publication Data

US 2012/0008724 A1 Jan. 12, 2012

Related U.S. Application Data

(62) Division of application No. 11/649,538, filed on Jan. 4, 2007, now Pat. No. 8,023,590.

(51) Int. Cl.
*H04L 25/40* (2006.01)
*H04L 27/00* (2006.01)

(52) U.S. Cl.
USPC .......................................... 375/371; 375/316

(58) Field of Classification Search
USPC ............ 375/371, 316, 359, 372, 376; 331/16, 331/17, 25; 327/141, 336
See application file for complete search history.

(56) References Cited

U.S. PATENT DOCUMENTS

| | | | |
|---|---|---|---|
| 4,706,040 A * | 11/1987 | Mehrgardt | 331/1 A |
| 5,307,020 A | 4/1994 | Marcuard | |
| 5,450,081 A | 9/1995 | Kuhn et al. | |
| 5,517,534 A * | 5/1996 | Knierim | 375/371 |
| 6,208,671 B1 | 3/2001 | Paulos et al. | |
| 6,560,276 B1 * | 5/2003 | Long et al. | 375/222 |
| 6,584,162 B1 | 6/2003 | Tinker | |
| 2002/0106026 A1 | 8/2002 | Demmer | |
| 2004/0120361 A1 | 6/2004 | Yu et al. | |
| 2005/0157828 A1 | 7/2005 | Midya et al. | |
| 2005/0280569 A1 | 12/2005 | Park | |

FOREIGN PATENT DOCUMENTS

EP 0147307 7/1985

OTHER PUBLICATIONS

Shipton et al., "Nicam Decoder for Digital Multi-Channel TV Sound Broadcast," IEEE Transactions on Consumer Electronics, vol. 37, p. 684 (1991).
Office Action dated Jan. 15, 2013 from corresponding Korean Application No. 10-2008-7019156.
European Search Report dated Nov. 2, 2010 from corresponding European Application No. 07716285.7.
International Search Report for Corresponding PCT Application No. PCT/US07/00135, dated Oct. 25, 2010.
International Telecommunication Union-Recommendations, Transmission of Multisound in Terrestrial Television Systems PAL B, D1, G, H and I and SECAM D, K, K1 and L, ITU-R BS.707-4, 1998.
Written Opinion for Corresponding PCT Application No. PCT/US07/00135, dated Apr. 2007.
Extended European Search Report dated Mar. 16, 2012 from Corresponding European Application No. 12000165.6.

* cited by examiner

*Primary Examiner* — Khai Tran
(74) *Attorney, Agent, or Firm* — McDermott Will & Emery LLP

(57) ABSTRACT

A NICAM audio signal re-sampler may include a non-linear interpolator configured to interpolate in a non-linear manner between sequential digital samples that are based on a stream of demodulated NICAM audio samples. A phase differential calculator may be included that compares phase information at different resolutions.

5 Claims, 3 Drawing Sheets

NICAM DECODER WITH OUTPUT RESAMPLER

CROSS-REFERENCE TO RELATED APPLICATION

This application is a divisional of prior U.S. application Ser. No. 11/649,538, filed Jan. 4, 2007, the contents of which are incorporated in their entirety herein by reference.

BACKGROUND

1. Technical Field

This application relates to the extraction of digitally-sampled audio, such as NICAM (Near-Instantaneous Companded Audio Multiplex), from a broadcast carrier.

2. Description of Related Art

NICAM audio is typically sampled with a 32 kHz clock at the point of transmission. A local 32 kHz sample clock is typically generated to drive a digital-to-analog converter at the receiver as part of the demodulation process. This local sample clock, however, is usually not synchronous with the remote sample clock. Some decoders, moreover, use local sample clocks at a different frequency, such as at 48 kHz or 44.1 kHz.

This lack of synchronization between the remote sample clock and the local sample clock can create errors in processing, resulting in distortion in the audio. Eliminating this distortion can require a large number of computations to be quickly performed, increasing the cost and complexity of the decoder.

SUMMARY

A digital sample rate converter may include a digital up sampler configured to receive a first stream of digital samples of an analog signal at a first frequency and to generate a second stream of digital samples at a second frequency that is substantially higher than the first frequency and that substantially tracks the first stream of digital samples. The converter may also include a non-linear interpolator configured to interpolate between two sequential digital samples in the second stream of digital samples in a non-linear manner.

The non-linear interpolator may be configured to interpolate between the two sequential digital samples by determining a non-linear function that substantially fits three sequential digital samples in the second stream that include the two sequential digital samples. The non-linear function may be a parabolic function.

The digital sample rate converter may include a digital delay line configured to generate at least two versions of the second stream of digital samples, each delayed by a different amount of time with respect to the second stream of digital samples.

The non-linear interpolator may be configured to interpolate at points in time that are based on a phase difference between the first stream of digital samples and a local sample clock.

The digital sample rate converter may include a phase differential calculator configured to calculate the phase differential. The phase difference calculator may include a phased-lock loop.

The digital sample rate converter may include a synchronizer configured to synchronize interpolations made by the non-linear interpolator with the local sample clock. The synchronizer may include a 2-word FIFO.

The first stream of digital samples may be demodulated NICAM audio samples at a frequency of approximately 32 kHz.

The local sample clock may have a frequency of approximately 31.25 kHz, 32 kHz, 44.1 kHz, 46.875 kHz, or 48 kHz.

The second frequency may be between 128 Khz to 1.024 Mhz. The second frequency may be approximately 384 kHz.

The digital up sampler may include a sample interpolator configured to divide each digital sample in the first stream into an integer multiple of samples. The sample interpolator may be configured to divide each digital sample in the first stream into between 4 and 32 samples. The sample interpolator may be configured to divide each digital sample in the first stream into 12 samples.

One of the integer multiple of samples may be based on the digital sample in the first stream and the other integer multiple samples may be substantially zero.

The digital up sampler may include a digital low pass filter and the digital low pass filter may be configured to filter the integer multiple of samples.

A phase differential calculator may include a first phase accumulator configured to generate information indicative of the phase of a local sample clock at a first resolution. The phase differential calculator may include a clock generator configured to generate a generated clock and information indicative of the phase of the generated clock at a second resolution that is lower than the first resolution as a function of a phase comparison and in synchronism with a remote sample clock. The phase differential calculator may include a phase comparator configured to generate the phase comparison based on a phase difference between the information indicative of the phase of the local sample clock and the information indicative of the phase of the generated clock.

The clock generator may include an adder configured to repeatedly add an amount to a sum that is a function of the phase comparison and in synchronism with the remote sample clock. The sum may be configured to reset after a predetermined number of additions.

The generated clock may be based on the sum generated by the adder.

The clock generator may be configured to generate the second clock based on a filtering of the phase comparison by a second order phase-locked loop filter.

The clock generator may be configured to update the information indicative of the phase of the generated clock at a frequency that is an integer multiple of the remote sample clock.

A NICAM audio signal re-sampler may include a non-linear interpolator configured to interpolate in a non-linear manner between sequential digital samples that are based on a stream of demodulated NICAM audio samples.

The NICAM audio signal re-sampler may include a local sample clock and a synchronizer configured to synchronize an interpolated stream of demodulated NICAM audio samples with the local sample clock.

The NICAM audio signal re-sampler may include a phase comparator configured to generate a measurement of phase difference between a signal that is synchronous with the stream of demodulated NICAM audio samples and a signal that is synchronous with the local sample clock.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings disclose illustrative embodiments. They do not set forth all embodiments. Other embodiments may be used in addition or instead. Details that may be apparent or unnecessary may be omitted to save space or for more effective illustration. When the same numeral appears in different drawings, it is intended to refer to the same or like components or steps.

DETAILED DESCRIPTION OF ILLUSTRATIVE EMBODIMENTS

Illustrative embodiments are now discussed. Other embodiments may be used in addition or instead. Details that may be apparent or unnecessary may be omitted to save space or for more effective presentation.

Figure 1:
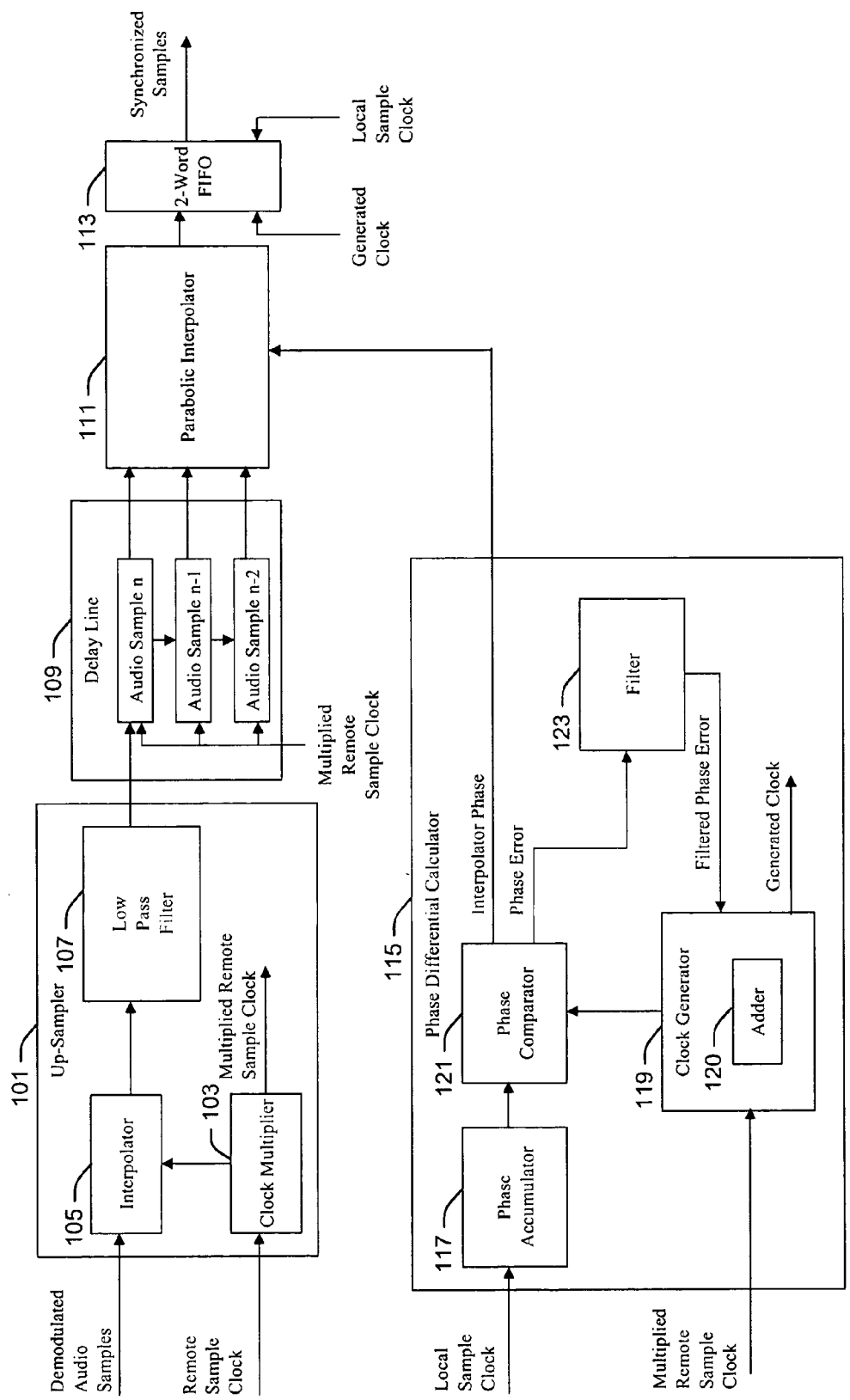
FIG. 1 is a block diagram of a resampler for one audio channel of a NICAM signal.

FIG. 1 is a block diagram of a resampler for one audio channel of a NICAM signal. As shown in FIG. 1, an up-sampler 101 may receive demodulated audio samples and a remote sample clock.

The demodulated audio samples may be any type of audio samples. For example, they may be one channel of digital audio samples that have been demodulated from a NICAM signal.

The demodulated audio samples may be at any frequency or resolution. For example, they may be at a frequency of 32 kHz and have a 14 bit resolution.

The remote sample clock may be a clock that is synchronous with the demodulated audio samples. For example, the remote sample clock may be a 32 kHz NICAM enable signal that has been decoded from a NICAM decoder.

The up-sampler 101 may include a clock multiplier 103. The clock multiplier 103 may be configured to produce a multiplied remote sample clock that represents the remote sample clock multiplied in frequency by an integer value. The integer may be selected to be high enough so as provide a desired degree of resolution, but not so high as to require a costly system to quickly process a large number of calculations. In one embodiment, the clock multiplier 103 may multiply the remote sample clock frequency by between 4 and 32 times, such as by 12 times.

When the remote sample clock is a 32 kHz NICAM enable signal, and when the integer multiplier is 12, the clock multiplier 103 may generate a multiplied remote sample clock at a frequency of approximately 384 kHz.

To accomplish this multiplication, the clock multiplier 103 may be driven with a high frequency local clock having a frequency that is approximately the frequency of the desired multiplied remote sample clock. In the example given, this may be a frequency of approximately 384 kHz. The high frequency local clock may be derived from a high frequency local system clock, such as a local system clock that may operate at approximately 35.804 mHz.

The clock multiplier 103 may be configured to use a periodic edge in the remote sample clock, such as a periodic rising or falling edge, as the first edge in the multiplied remote sample clock. The clock multiplier 103 may be configured to inject the remaining needed pulses before the next periodic edge of the remote sample clock from the high frequency local clock. If 12 is used as the multiplier for the clock multiplier 103, for example, the clock multiplier 103 may therefore pass the first pulse from the remote sample clock and follow this with 11 pulses from the high frequency local clock, following which this cycle of 1 pulse from the remote sample clock and 11 pulses from the high frequency local clock may repeat.

The up-sampler 101 may include an interpolator 105. The interpolator 105 may be configured to interpolate between samples of the demodulated audio samples. The interpolator 105 may be configured to do so at the frequency of the multiplied remote sample clock generated by the clock multiplier 103 and in synchronism with it. In this configuration, the interpolator 105 may be configured to output the current value of the demodulated audio sample as a first value. During the next 11 cycles of the multiplied remote sample clock, the interpolator 105 may be configured to output a value representative of zero.

The up-sampler 101 may include a low pass filter 107. The interpolated samples from the interpolator 105 may pass through the low pass filter 107. The low pass filter may be configured to smoothen the interpolated samples from the interpolator 105. The low pass filter 107 may be a digital low pass filter and may provide filtered values at the frequency of the multiplied remote sample clock. The effect of the low pass filter 107, therefore, may be to create interpolated values at the frequency of the multiplied remote sample clock between each of the varying values of the demodulated audio samples which may be at a far lower frequency.

The output of the up-sampler 101 may be delivered to a digital delay line 109. The digital delay line 109 may be configured to generate at least three versions of the up-sampled demodulated audio samples, two of which are successively delayed with respect to the up-sampled demodulated audio samples. As reflected in FIG. 1, the multiplied remote sample clock may be used to clock the digital delay line 109. The digital delay line 109 may therefore simultaneously output three sequential samples of the up-sampled demodulated audio samples.

A parabolic interpolator 111 may be configured to interpolate between any two of these samples at a point that is based on interpolator phase information received from a phase differential calculator 115 (discussed below). The parabolic interpolator 111 may be configured to do so by fitting a parabolic function to a set of three sequential points that contain the two sequential points between which an interpolation is desired. The parabolic interpolator 111 may use this fitted parabolic function to calculate the desired interpolated value.

As is well known, a parabolic function is a non-linear function. The interpolator 111 may instead be configured to fit a non-linear function to the three points that is not a parabolic function. The interpolator 111 may instead be configured to fit a linear function to the two consecutive points between which an interpolation is desired.

The output of the parabolic interpolator 111 may be directed into a synchronizer, such as into a 2-word FIFO (first in first out) 113. The 2-word FIFO 113 may be configured to load the interpolated value from the parabolic interpolator 111 into the first word of the FIFO upon command of a generated clock (discussed below). It may be configured to shift that loaded value into the second word of the FIFO upon command of a local sample clock (discussed below). The net effect of this operation of the 2-word FIFO 113 may be to cause the interpolated values provided by the parabolic interpolator 111 to be synchronized to the local sample clock. A different form of synchronizer may be used instead.

The local sample clock may be a local clock that the NICAM decoder extracts from the high frequency local system clock and which the NICAM decoder uses to drive a local digital-to-analog converter to convert the remote demodulated audio samples from their digital to analog format. However, the remote demodulated audio samples may not be synchronized to the local sample clock. Indeed, the local sample clock may even be at a different frequency. When operating with NICAM signals, for example, the local sample clock may have a frequency of approximately 31.25 kHz, 32 kHz, 44.1 kHz, 46.875 kHz, 48 kHz, or any other amount.

The function of the phase differential calculator 115 may be to calculate a difference in phase between the local sample clock and a signal that is based upon the remote sample clock, such as the multiplied remote sample clock. Information relating to this phase difference may be used by the parabolic interpolator 111 to direct the parabolic interpolator 111 to the location between two of the points from the digital delay line 109 at which an interpolated value is desired.

The phase differential calculator 115 may include a phase accumulator 117. The phase accumulator 117 may be configured to generate information indicative of the phase of the local sample clock.

The phase accumulator 117 may use any approach for accomplishing this. For example, the phase accumulator may use the local sample clock as a gate to a counter that counts local system clock pulses, such as pulses that may be at a frequency of 36.804 mHz. The count might begin on each periodic edge of the local sample clock, such as upon each rising or falling edge, and recycle on the next periodic edge. The value of this count may therefore be representative of the phase of the local sample clock.

The phase differential calculator 115 may include a clock generator 119 that may include an adder 120. The clock generator 119 may be configured to add the value of a filtered phase error (discussed below) using the adder 120 during each cycle of the multiplied remote sample clock. The adder 120 may be configured to reset after a predetermined number of the multiplied remote sample clock pulses so as to result in the stream of added values having a cycling frequency, referred to in FIG. 1 as the generated clock, that is substantially the same as the frequency of the local sample clock.

For example, if the remote sample clock and the local sample clock are both operating at approximately 32 kHz, and if the multiplied remote sample clock has a frequency of approximately 384 kHz, the clock generator 119 may be configured to add the filtered phase error to the count 12 times before recycling the count. The values of the added count may thus be representative of the phase of the generated clock, but adjusted based on the filtered phase error.

The phase differential calculator may include a phase comparator 121. The phase comparator 121 may be configured to compare the information from the phase accumulator 117 that is indicative of the phase of the local sample clock with the information from the clock generator 119 that is indicative of the phase of the generated clock, i.e., with the value provided by the adder 120. The phase comparator 121 may generate a phase error indicative of the result of this comparison. The phase differential calculator 115 may include a filter 123 that is configured to filter this phase error and to deliver the filtered phase error back to the clock generator 119. The filter 123 may provide any type of filtering function. For example, the filter 123 may be a second order phase-locked loop filter. The filter 123 may be scaled to allow for a fixed amount of jitter before allowing the phase-locked loop phase error to influence the output.

The output of the filter 123 may serve as the value which is added by the adder 120 during each cycle of the multiplied remote sample clock, until the adder resets. The net effect may be to create a phase-locked loop that generates a generated clock that is substantially locked in phase to the local sample clock by comparing information indicative of the phase of the generated clock with information indicative of the phase of the local sample clock. The count that is indicative of the phase of the generated clock may be updated at a frequency that is lower than the frequency at which the count that is indicative of the phase of the local sample clock is updated. Thus, the information that is indicative of the phase of the generated clock may be at a lower resolution than the information that is indicative of the phase of the local sample clock.

The output of the phase comparator 121 may be used by the parabolic interpolator 109 to signify the location between two of the points in the digital delay line 109 at which an interpolation is needed, as discussed above.

Figure 2:
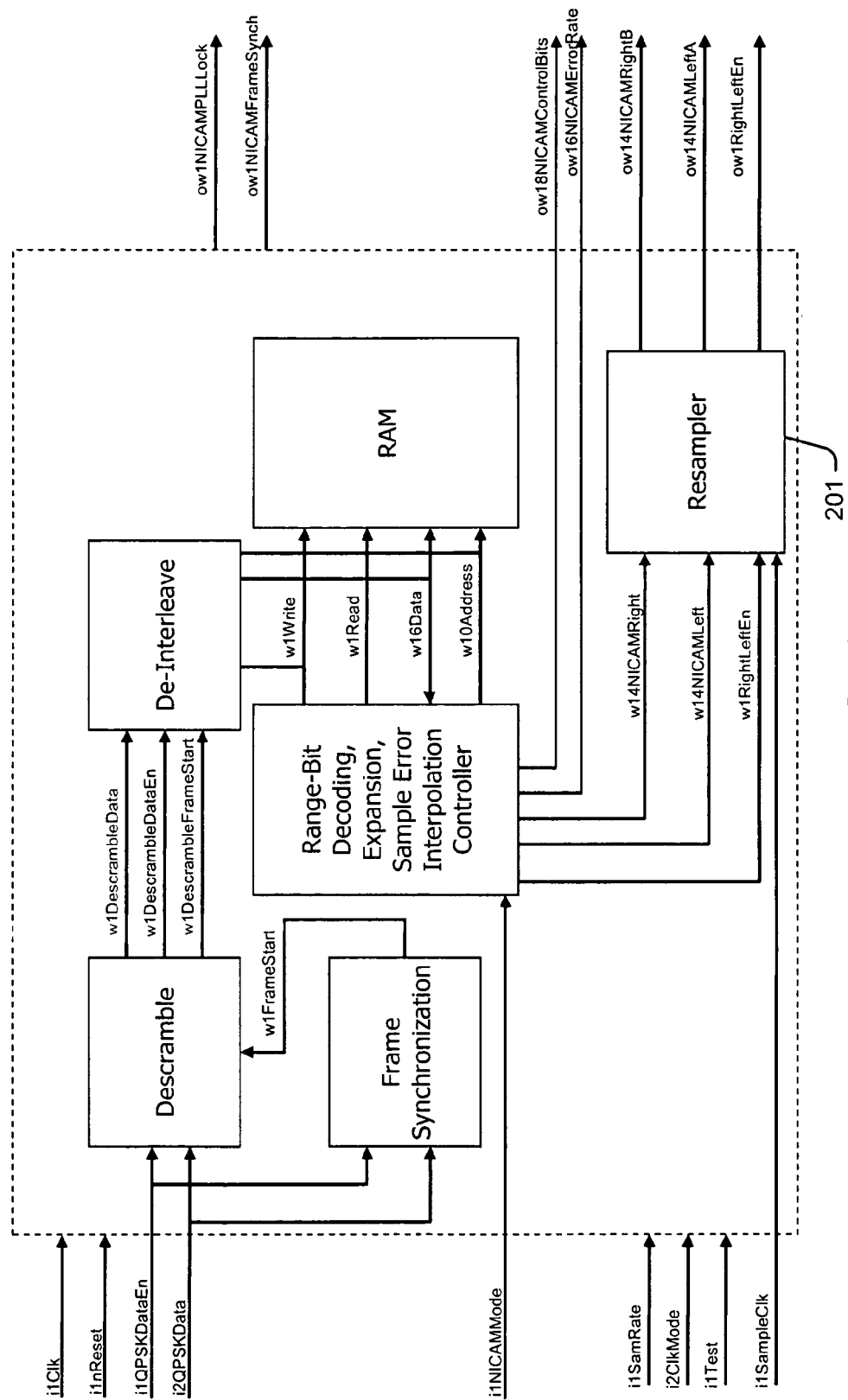
FIG. 2 is a block diagram a NICAM processor that includes the NICAM resampler illustrated in FIG. 1.

FIG. 2 is a block diagram of a NICAM processor that includes the NICAM resampler illustrated in FIG. 1. FIG. 2 follows a standard signal naming convention in which a prefix indicates the direction and bit width of the named signal: "i" for input; "w" for a wire; and "ow" for an output wire. The type prefix is followed by a numeric indication of the bit width of the signal.

The NICAM resampler that is illustrated in FIG. 1 may be part of a resampler 201 in FIG. 2 and used to resample one of the two NICAM channels of demodulated audio samples, indicated in FIG. 2 as w14NCAMRight. A duplicate of the resampler that is illustrated in FIG. 1 may be another part of the resampler 201 and used to resample the other NICAM channel of demodulated audio samples, indicated in FIG. 2 as w14NICAMLeft. The signal w1RightLeftEn to the resampler 201 may be the remote sample clock referred to in FIG. 1 and discussed above.

The remaining portions of the NICAM processor shown in FIG. 2 may be the same as in a standard NICAM 728 processor.

Prior to modulation in the transmitting system, the NICAM 32 kHz sampled audio data stream may have been compressed, framed, interleaved, scrambled, and assigned parity bits with embedded compounding information to facilitate expansion at the receiving equipment. The other functions depicted in FIG. 2 may take the serial dibits from a DQOSK demodulator (i2QPSKData) and enable (i2QPSKDataEn) signals and reverse all of this pre-modulation processing. First, frame synchronization may be achieved. Next, the data in each frame may be descrambled. After descrambling, the data may be de-interleaved. Finally, parity bits may be checked and the audio samples may be expanded.

Each NICAM frame may have a length of 1 msec (defined at the point of transmission) and may deliver, after expansion, thirty-two 14 bit samples for each stereo channel (w14NICAMRight, w14NICAMLeft). Each 1 msec interval may be defined as 364 of the recovered it QPSKDataEn pulses. These pulses may be generated by a symbol timing recovery algorithm in a DQPSK demodulator. The 32 samples may be delivered to the resampler shown in FIG. 1 at a rate of 32 kHz (32 per each 1 msec interval), along with an accompanying enable (w1RightLeftEn) pulse.

Figure 3:
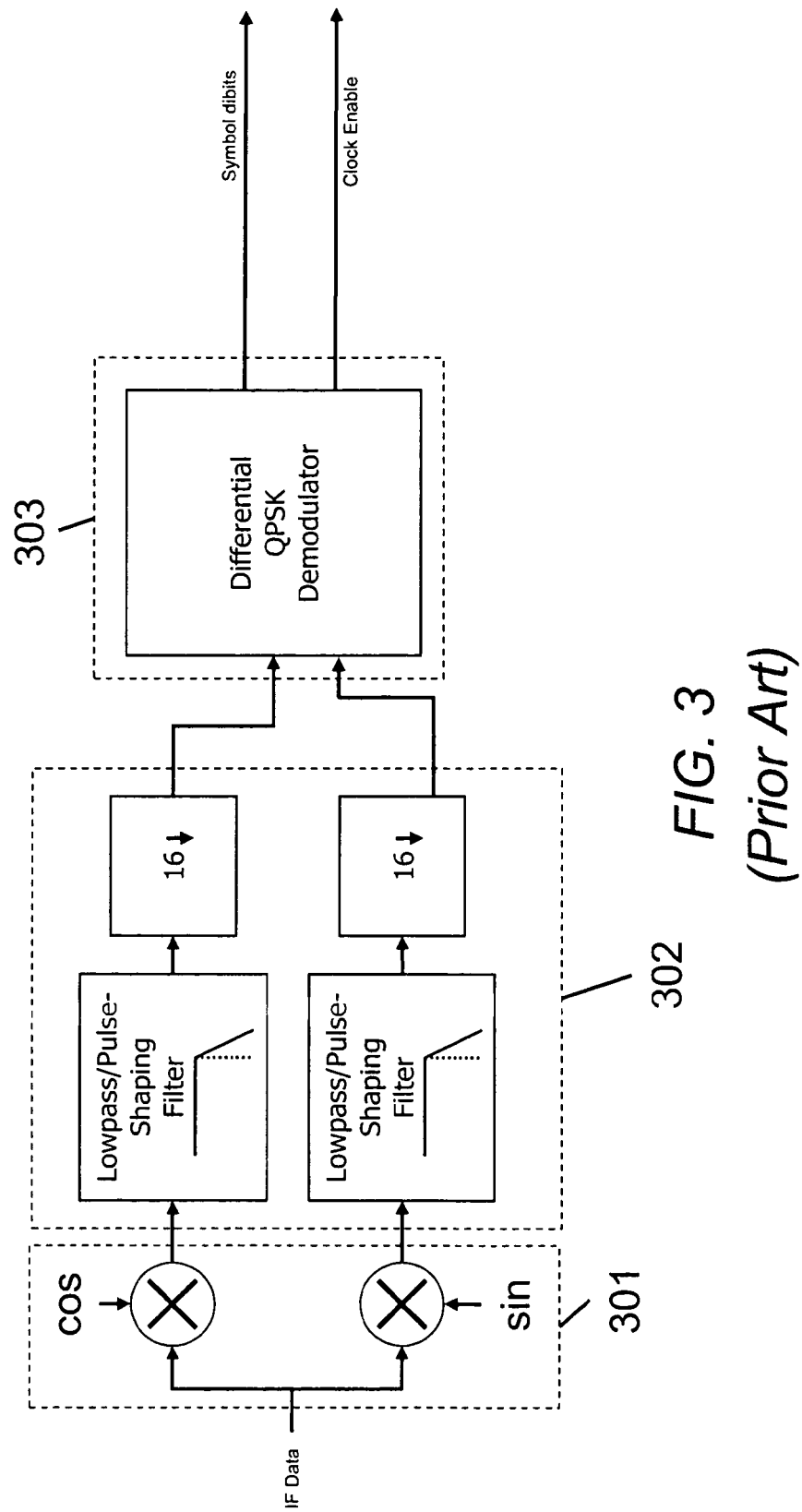
FIG. 3 is a block diagram of a prior art FM/DQPSK demodulator that may be used to generate signals used by the NICAM processor illustrated in FIG. 2.

FIG. 3 is a block diagram of a prior art FM/DQPSK demodulator that may be used to generate signals used by the NICAM processor illustrated in FIG. 2. The digital audio input at some intermediate frequency (IF Data) may first be down converted to baseband by a downconverter 301. Next, the undesired mixing product may be removed via a low pass filter in a down-sampler 302, which also may meet the NICAM root raised cosine pulse shaping requirement. After filtering, the data may be sub-sampled by 16 up-samples in the down-sampler 302. At this point, a baseband quadrature signal may be available for a DQPSK demodulator 303. The DQPSK demodulator 303 may recover the symbol clock and make a decision on each symbol point. The decided two-bit data may be output along with a data enable, which may occur at a rate determined by the symbol clock of the transmitting system.

The various functions that are illustrated in FIGS. 1-3 and that have been described above may be implemented by hardware, software, or by a combination of hardware and software, all in accordance with well-known techniques. For example, Hardware Description Language (HDL) coding may be written from which an integrated hardware implementation may be created, again, all in accordance with well-known techniques. An example of such HDL coding is set forth in U.S. Provisional Application Ser. No. 60/756,515, entitled "NICAM Decoder With Output Resampler," filed Jan. 5, 2006, the entire content of which is incorporated herein by reference.

The components, steps, features, objects, benefits and advantages that have been discussed are merely illustrative. None of them, nor the discussions relating to them, are intended to limit the scope of protection in any way. Numerous other embodiments are also contemplated, including embodiments that have fewer, additional, and/or different components, steps, features, objects, benefits and advantages. The components and steps may also be arranged and ordered differently.

For example, the resampler illustrated in FIG. 1 and discussed above may be used in connection with audio signals other than NICAM signals, such as MP2, MP3 or MP4 audio. Indeed, the resampler may be to change the sample rate of any type of unsynchronized sample stream.

Although having been primarily discussed in connection with a local sample clock frequency of 32 kHz, the resamplers that have been discussed may also advantageously be used in connection with local sample clocks of other frequencies, such as approximately 31.25 kHz, 44.1 kHz, 46.875 kHz, and/or 48 kHz.

The phrase "means for" when used in a claim embraces the corresponding structures and materials that have been described and their equivalents. Similarly, the phrase "step for" when used in a claim embraces the corresponding acts that have been described and their equivalents. The absence of these phrases means that the claim is not limited to any of the corresponding structures, materials, or acts or to their equivalents.

Nothing that has been stated or illustrated is intended to cause a dedication of any component, step, feature, object, benefit, advantage, or equivalent to the public, regardless of whether it is recited in the claims.

In short, the scope of protection is limited solely by the claims that now follow. That scope is intended to be as broad as is reasonably consistent with the language that is used in the claims and to encompass all structural and functional equivalents.

The invention claimed is:

1. A phase differential calculator comprising:
a first phase accumulator configured to generate information indicative of the phase of a local sample clock at a first resolution;
a clock generator configured to generate a generated clock and information indicative of the phase of the generated clock at a second resolution that is lower than the first resolution as a function of a phase comparison and in synchronism with a remote sample clock, wherein the clock generator includes an adder configured to repeatedly add an amount to a sum that is a function of the phase comparison and in synchronism with the remote sample clock; and
a phase comparator configured to generate the phase comparison based on a phase difference between the information indicative of the phase of the local sample clock and the information indicative of the phase of the generated clock.

2. The phase differential calculator of claim 1, wherein the sum is configured to reset after a predetermined number of additions.

3. The phase differential calculator of claim 2, wherein the generated clock is based on the sum generated by the adder.

4. A phase differential calculator comprising:
a first phase accumulator configured to generate information indicative of the phase of a local sample clock at a first resolution;
a clock generator configured to generate a generated clock and information indicative of the phase of the generated clock at a second resolution that is lower than the first resolution as a function of a phase comparison and in synchronism with a remote sample clock, wherein the clock, generator is configured to generate the generated clock based on a filtering of the phase comparison by a second order phase-locked loop filter; and
a phase comparator configured to generate the phase comparison based on a phase difference between the information indicative of the phase of the local sample clock and the information indicative of the phase of the generated clock.

5. A phase differential calculator comprising:
a first phase accumulator configured to generate information indicative of the phase of a local sample clock at a first resolution;
a clock generator configured to generate a generated clock and information indicative of the phase of the generated clock at a second resolution that is lower than the first resolution as a function of a phase comparison and in synchronism with a remote sample clock, wherein the clock generator is configured to update the information indicative of the phase of the generated clock at a frequency that is an integer multiple of the remote sample clock; and
a phase comparator configured to generate the phase comparison based on a phase difference between the information indicative of the phase of the local sample clock and the information indicative of the phase of the generated clock.

* * * * *